(12) United States Patent
Ito

(10) Patent No.: US 12,180,002 B2
(45) Date of Patent: Dec. 31, 2024

(54) STORAGE RACK

(71) Applicant: Murata Machinery, Ltd., Kyoto (JP)

(72) Inventor: Yasuhisa Ito, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 81 days.

(21) Appl. No.: 18/035,322

(22) PCT Filed: Sep. 27, 2021

(86) PCT No.: PCT/JP2021/035374
§ 371 (c)(1),
(2) Date: May 4, 2023

(87) PCT Pub. No.: WO2022/102264
PCT Pub. Date: May 19, 2022

(65) Prior Publication Data
US 2023/0406621 A1 Dec. 21, 2023

(30) Foreign Application Priority Data

Nov. 12, 2020 (JP) ................................. 2020-188871

(51) Int. Cl.
B65G 1/04 (2006.01)
B65G 1/02 (2006.01)
H01L 21/673 (2006.01)

(52) U.S. Cl.
CPC ............. *B65G 1/0457* (2013.01); *B65G 1/02* (2013.01); *H01L 21/673* (2013.01); *B65G 2201/0297* (2013.01)

(58) Field of Classification Search
CPC .................... B65G 1/02; B65G 1/0457; B65G 2201/0297; H01L 21/673
See application file for complete search history.

(56) References Cited

U.S. PATENT DOCUMENTS 7,437,999 B2 * 10/2008 Nakao .................... B65G 37/02
414/280
8,348,588 B2 * 1/2013 Yoshida ............ H01L 21/67736
414/940

(Continued)

FOREIGN PATENT DOCUMENTS

JP 2009-120299 A 6/2009
JP 2015-533026 A 11/2015

(Continued)

OTHER PUBLICATIONS

International Search Report dated Dec. 14, 2021 in counterpart International Application No. PCT/JP2021/035374 w/English translation.

(Continued)

*Primary Examiner* — Stanton L Krycinski
(74) *Attorney, Agent, or Firm* — DLA Piper LLP (US)

(57) ABSTRACT

The storage rack includes two base frames suspended from the ceiling, and two beam members bridged over the base frames and included in a loading portion on which a container is placed. A kinematic pin configured to position the container, a nozzle configured to supply fluid into the container, a distribution pipe configured to send the fluid to the nozzle, and a regulator provided to the distribution pipe configured to adjust the fluid are attached to one of the beam members.

7 Claims, 9 Drawing Sheets

(56) References Cited

U.S. PATENT DOCUMENTS

| | | | |
|---|---|---|---|
| 9,139,380 B2* | 9/2015 | Inui | H01L 21/67733 |
| 9,359,135 B2* | 6/2016 | Nagamine | H01L 21/67769 |
| 9,412,631 B2* | 8/2016 | Jang | H01L 21/67775 |
| 9,845,193 B2* | 12/2017 | Yamamoto | G05B 19/418 |
| 10,141,213 B2* | 11/2018 | Yoo | H01L 21/67733 |
| 10,325,794 B2* | 6/2019 | Murata | H01L 21/67769 |
| 10,325,797 B2* | 6/2019 | Iwasaki | H01L 21/67389 |
| 11,052,926 B2* | 7/2021 | Imahori | B66C 1/28 |
| 11,171,027 B2* | 11/2021 | Ito | B65G 1/0457 |
| 11,501,991 B2 | 11/2022 | Tsubaki et al. | |
| 11,631,603 B2 | 4/2023 | Tsubaki et al. | |
| 11,952,213 B2* | 4/2024 | Torazawa | H01L 21/67769 |
| 11,990,356 B2* | 5/2024 | Tsubaki | B65G 1/14 |
| 2008/0056864 A1* | 3/2008 | Wada | B65G 1/0457 |
| | | | 700/28 |
| 2008/0193270 A1* | 8/2008 | Yoshida | B66C 1/28 |
| | | | 414/731 |
| 2009/0120320 A1 | 5/2009 | Kato | |
| 2012/0128452 A1* | 5/2012 | Murata | H01L 21/67379 |
| | | | 414/222.01 |
| 2014/0017040 A1* | 1/2014 | Takahara | H01L 21/67769 |
| | | | 414/222.01 |
| 2015/0235884 A1 | 8/2015 | Jang et al. | |
| 2023/0134774 A1* | 5/2023 | Tsubaki | B65G 1/02 |
| | | | 454/193 |

FOREIGN PATENT DOCUMENTS

| | | |
|---|---|---|
| WO | 2017/212841 A1 | 12/2017 |
| WO | 2020/017137 A1 | 1/2020 |

OTHER PUBLICATIONS

Written Opinion dated Dec. 14, 2021 in counterpart International Application No. PCT/JP2021/035374.

* cited by examiner

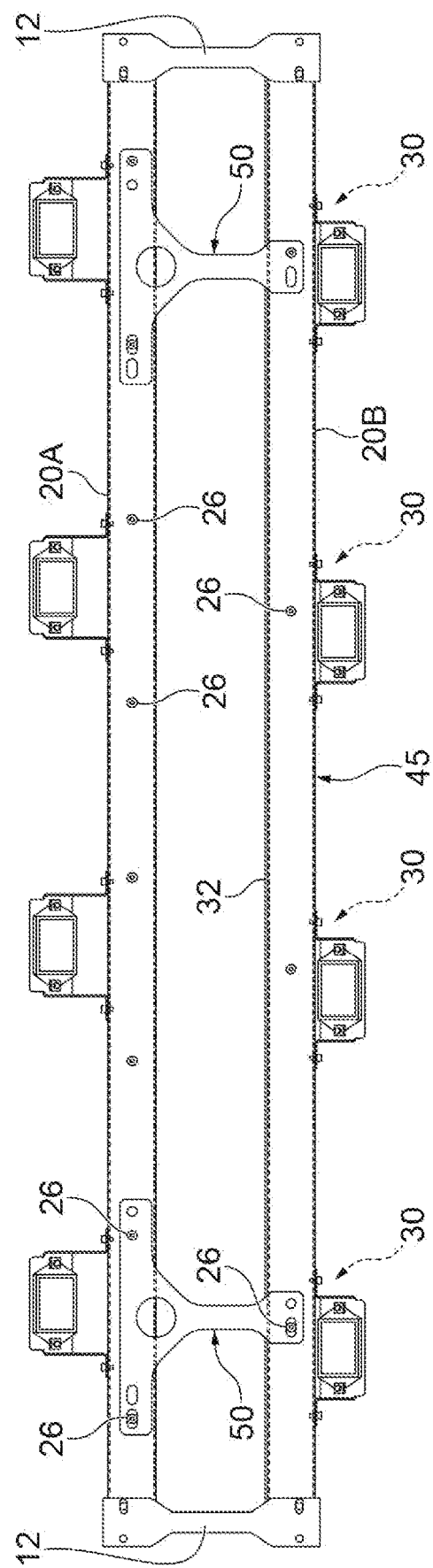

STORAGE RACK

TECHNICAL FIELD

This disclosure relates to a storage rack that stores containers and has a purging function for the containers.

BACKGROUND

Conventionally, storage racks are known to receive and store containers from vehicles (traveling vehicles) traveling along rails installed in a ceiling. For example, storage racks described in Japanese Unexamined Patent Publication No. 2015-533026 each include a purge assembly configured to purge a wafer housed in the container with gas.

For the conventional storage racks described above, a bottom frame and side wall frames forming a framework are provided, and a plurality of racks are installed on the bottom frame. The purge assembly includes a main-pipe configured to supply and collect gas, a sub-pipe connected to a nozzle of each of the storage racks, a supply valve, a supply flow meter, a discharge valve, a discharge flow meter, and the like. Such various types of devices are attached to the rail or any one of the frames. It takes considerable effort to assemble (construct) a storage rack including such a purge assembly on site.

It could therefore be helpful to provide a storage rack with a purging function and a storage rack enabling on-site construction to be easily performed.

SUMMARY

A storage rack includes: at least two base frames suspended from a ceiling; and at least two beam members bridged over the base frames and included in a loading portion on which a container is placed, in which a positioning pin configured to position a container, a nozzle configured to supply fluid into the container, a pipe configured to send the fluid to the nozzle, and a regulator provided in the pipe and configured to regulate the fluid are attached to at least one beam member of the beam members.

With this storage rack, the positioning pin, the nozzle, the pipe, and the regulator can be attached to at least one beam member of the beam members in advance. Thus, it is possible to easily perform on-site construction of a storage rack with a purging function. Such a beam member has an advantage that main devices required for adding the purging function are already unitized and integrated into the beam member. For example, when adding a purging function to a storage rack not include an existing purging function, it is possible to perform construction by simply replacing the beam member on site.

The at least one beam member is a member having a C-shaped cross section or an L-shaped cross section, and the nozzle may be attached to an inner surface side of the at least one beam member. The nozzle can be compactly and easily disposed. Determining a positional relation of the nozzle relative to the positioning pin in a predetermined position in advance can increase also accuracy of placement of the nozzle.

Out of the three positioning pins disposed in the loading portion, the one or two positioning pins may be provided in another beam member different from the at least one beam member described above. By using one or two positioning pins provided in the other beam member, the beam member to which devices related to the purging function are attached can be easily positioned.

At least one beam member may have three flat portions included in a C-shaped cross section or two flat portions included in an L-shaped cross section, and a surface of one of those flat portions may be included in a loading portion. A top surface of the beam member may be included in the loading portion, and thus there is no need to separately attach a plate member or the like to the top surface of the beam member. Thus, the height of the loading portion can be easily adjusted.

It is thus possible to easily perform on-site construction of a storage rack with a purging function.

BRIEF DESCRIPTION OF THE DRAWINGS

FIG. 8 is a plan view illustrating a storage rack positioned with a jig.

Figure 1:
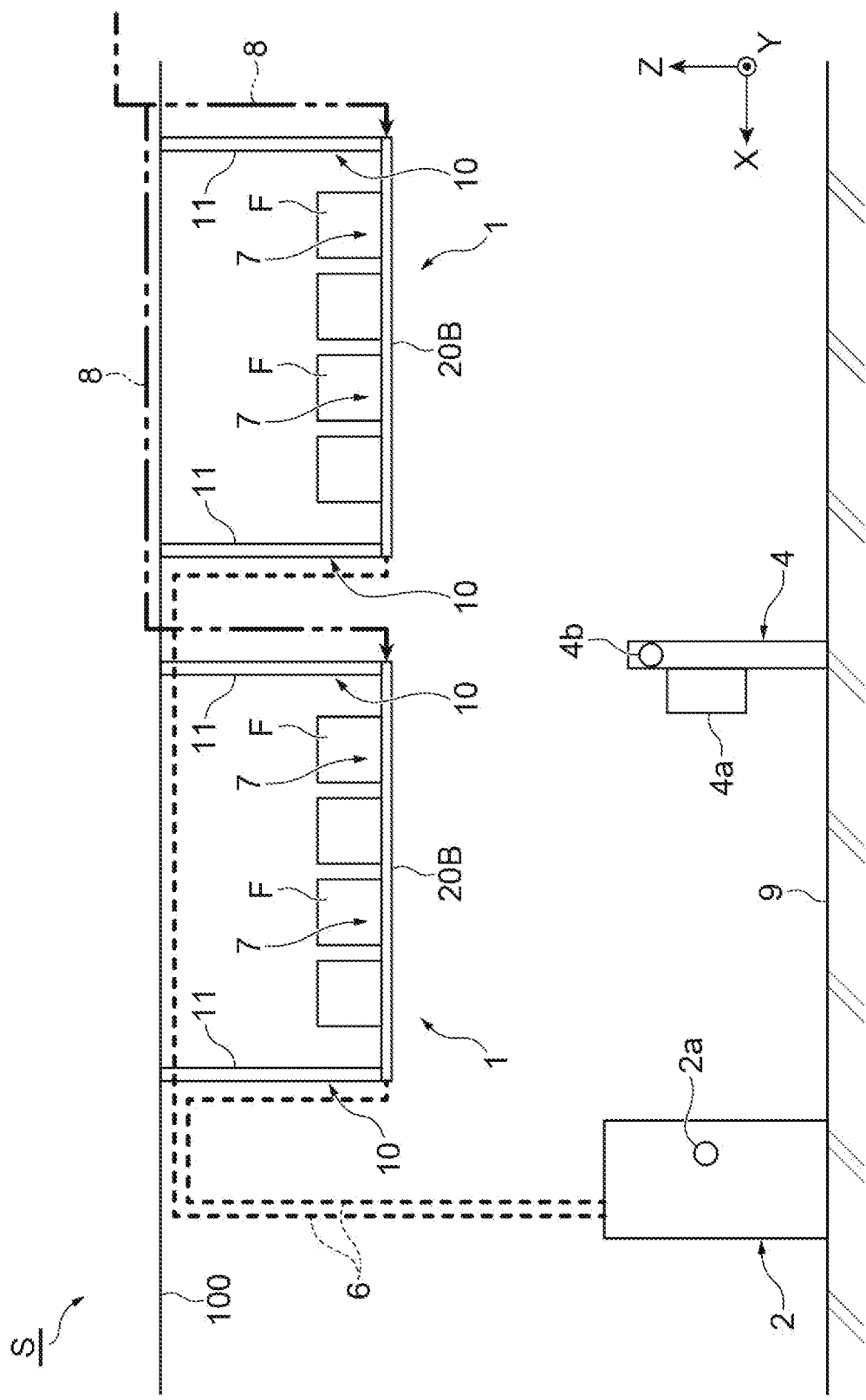
FIG. 1 is a schematic view illustrating a whole structure of a storage rack according to an example.

REFERENCE SIGNS LIST 1 storage rack
3 overhead traveling vehicle
5 track
7 Loading portion
7a placement surface
10 base frame
20A, 20B beam members
21 first flat portion
21a top (surface)
22 second flat portion
23 third flat portion
26 kinematic pin (positioning pin)
30 additional unit
31 nozzle
32 main pipe
33 distribution pipe
34 regulator
36 solenoid valve
37 flow regulation valve
38 filter
39 loading sensor
40 reflector
100 ceiling
S semiconductor transfer system

DETAILED DESCRIPTION

The following describes examples with reference to the drawings. In the description of the drawings, like elements are designated by like reference signs, and duplicate description is omitted. The terms "X-direction," "Y-direction," and "Z-direction" are based on directions illustrated in the drawings and are given for convenience.

Figure 2:
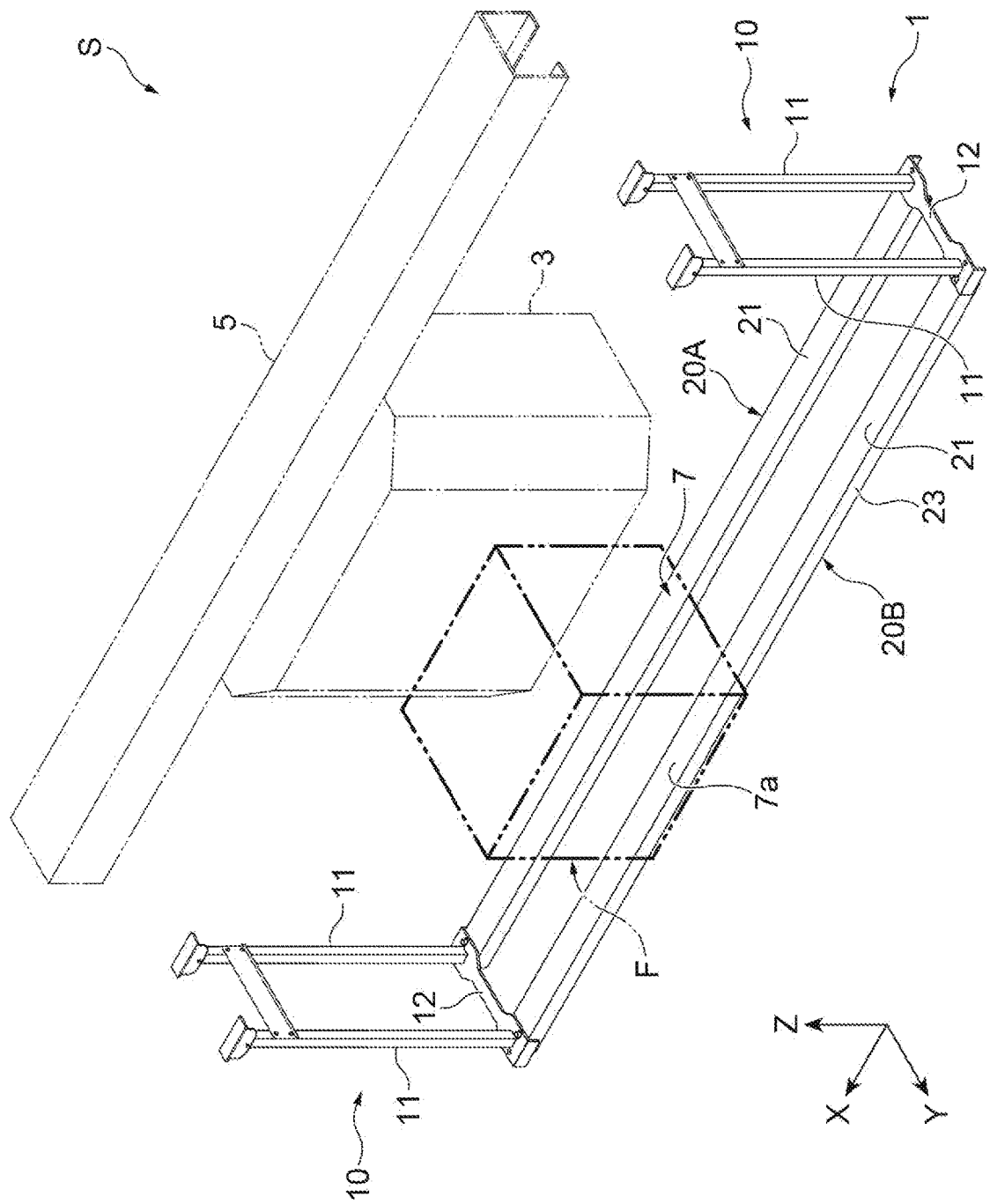
FIG. 2 is a perspective view illustrating the storage rack of FIG. 1 and an overhead traveling vehicle and a rail.

As illustrated in FIGS. 1 and 2, a storage rack 1 is disposed along tracks 5 for overhead traveling vehicles 3 included in a semiconductor conveyance system S of a semiconductor manufacturing plant, for example. The storage rack 1 temporarily stores therein a container F such as a FOUP or a reticle pod. The storage rack 1 is configured to purge an interior of the container F with a purge gas (fluid) such as nitrogen.

As illustrated FIG. 1, the semiconductor conveyance system S includes a plurality of storage racks 1 suspended from a ceiling 100, a distribution board 2 configured to supply power to the storage racks 1 via a power supply wiring 6, a monitoring stand 4 configured to monitor oxygen concentration in a factory, and a gas supply pipe 8 mounted on the ceiling 100 and configured to supply purge gas to each of the storage racks 1. Purge gas adjusted to a desired pressure is supplied to the gas supply pipe 8. The distribution board 2 and the monitoring stand 4 are installed, for example, on a floor 9. The distribution board 2 may be provided with an emergency stop button 2a to stop supply of the purge gas to the storage rack 1 in an emergency or other circumstances. The monitoring stand 4 is provided with an oxygen concentration sensor 4a. The monitoring stand 4 may be provided with an emergency stop button 4b to stop supply of the purge gas in an event of drop of oxygen concentration or other circumstances.

As illustrated in FIGS. 1 and 2, each of the storage racks 1 includes, for example, two base frames 10, 10 suspended from the ceiling 100 and two beam members 20A, 20B bridged over the two base frames 10, 10. Each base frame 10 has, for example, two suspensions 11 suspended from the ceiling 100 and extend in the vertical direction, Z, and one support 12 that is bridged over the lower ends of the suspensions 11 suspended from the ceiling 100 and extending in the Z direction that is a vertical direction and one support 12 extending in the Y direction that is a horizontal direction. The beam members 20A, 20B are, for example, by being attached to lower surfaces of the two supports 12, 12, spaced apart in the X direction, bridged over the two base frames 10, 10.

The beam members 20A, 20B are members made of channel steel having a C-shaped cross section, for example. The beam members 20A, 20B extend parallel to each other in the X direction that is a horizontal direction and are spaced apart in the Y direction. The beam members 20A, 20B are disposed at equal heights fitting to the position of the overhead traveling vehicle 3. In each of the storage racks 1, the beam members 20A, 20B are included in a plurality (four in FIGS. 1 and 2) of loading portions 7 on which containers F are placed. Since the beam members 20A, 20B are included in the loading portion 7, the distance between the beam members 20A, 20B is smaller than the length of the bottom surface of the container F in the Y direction. The loading portion 7 includes a placing surface 7a that is horizontal formed parallel to an XY plane so that the container F can be placed horizontally on the loading portion 7.

The beam members 20A, 20B may be steel members having the same size or may be steel members having different sizes. In this example, a purge unit 30 enabling purging to the container F is attached to one beam member 20B out of the two beam members 20A, 20B. The following describes a configuration of the beam member 20B and the purge unit 30 with reference to FIGS. 3 to 5 and FIGS. 7(a) and 7(b). Illustrating the purge unit 30 attached to the beam member 20B is omitted in FIG. 2.

Figure 3:
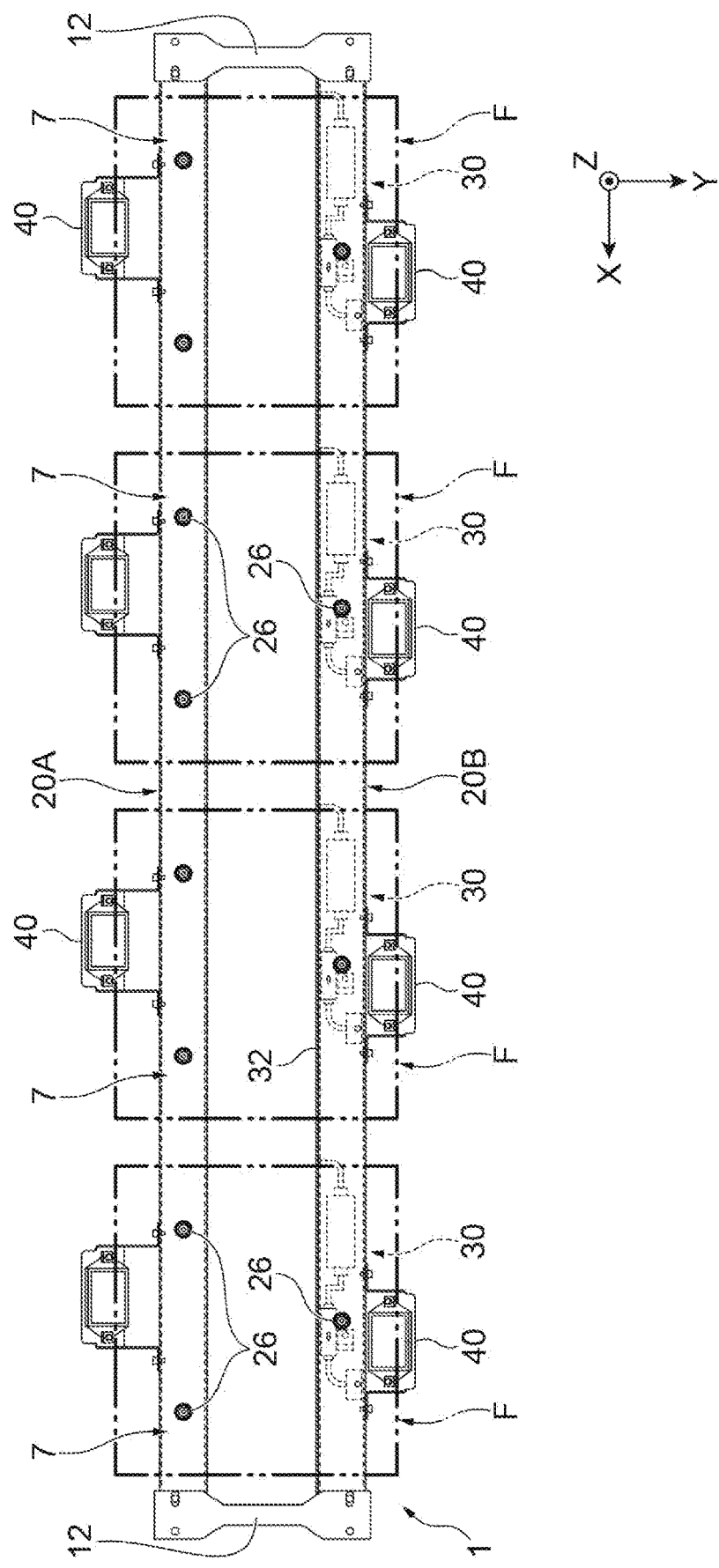
FIG. 3 is a plan view of the storage rack.
Figure 4:
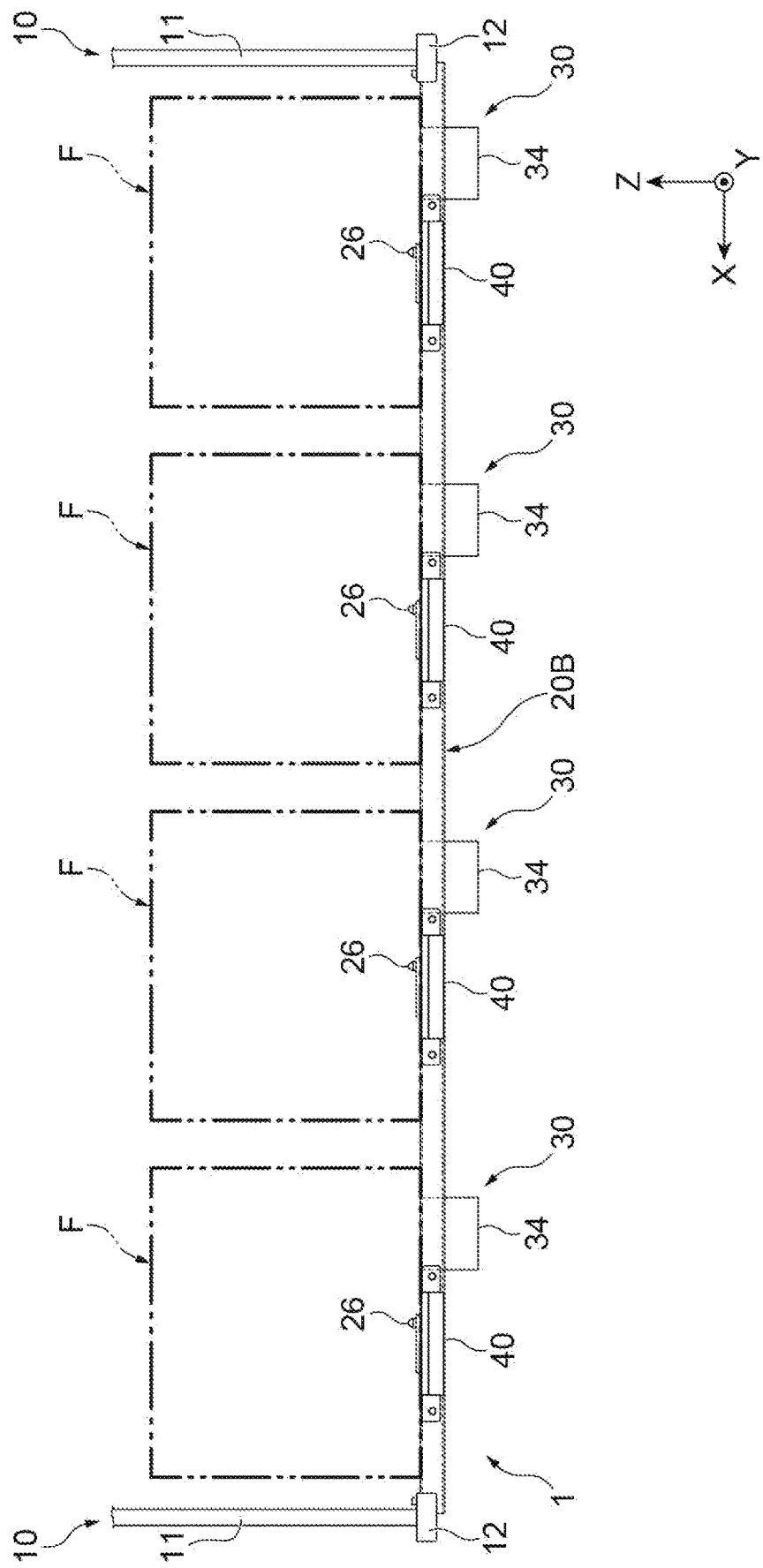
FIG. 4 is a front view of the storage rack.
Figure 5:
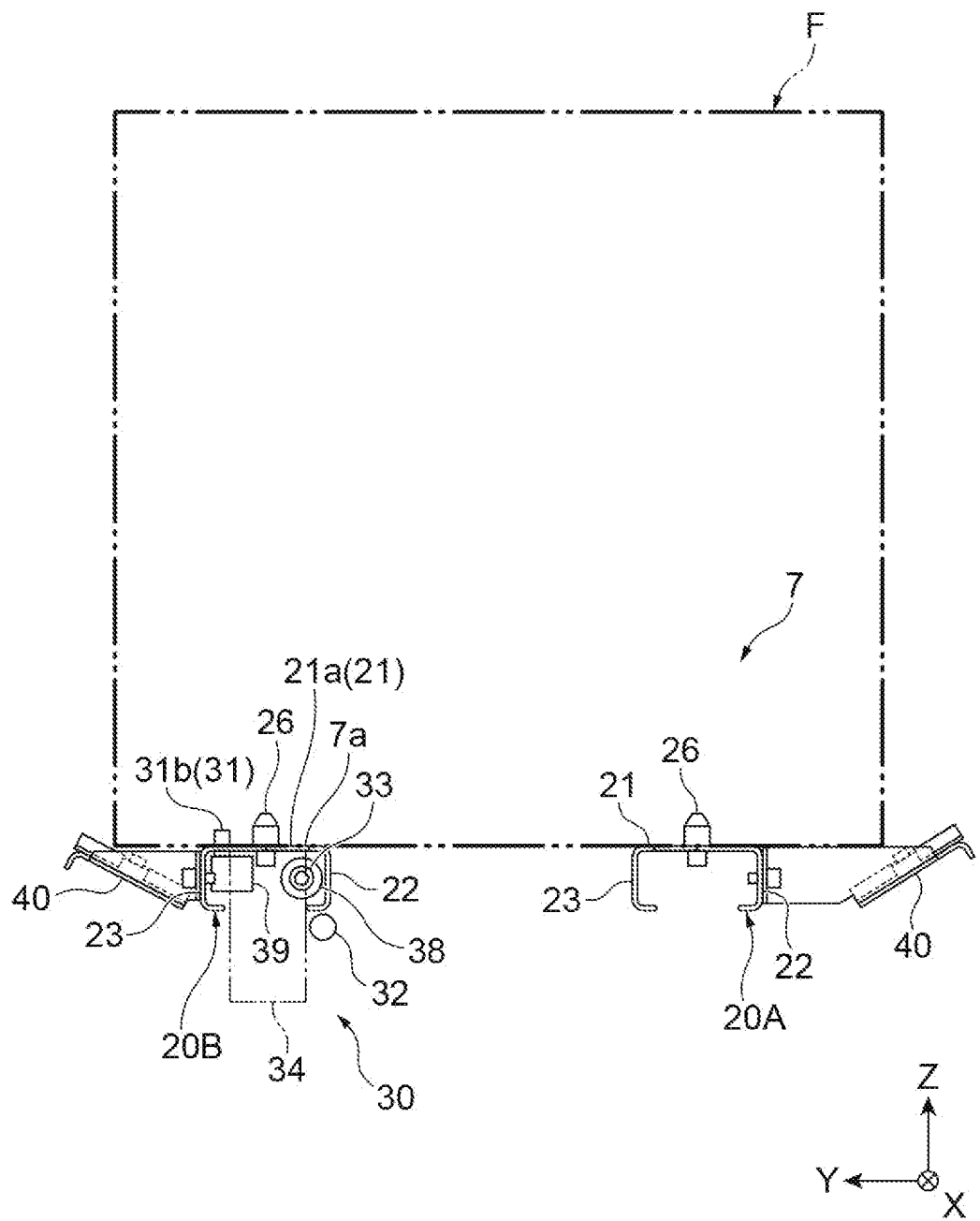
FIG. 5 is a side view of the storage rack.

As illustrated in FIGS. 3 to 5, the container F is placed on the loading portion 7 including the beam member 20A and the beam member 20B. The storage rack 1 is provided with three kinematic pins 26 configured to position the container F per loading portion 7. As illustrated in FIG. 3, two kinematic pins 26 are provided in the beam member 20A and one kinematic pin 26 is provided in the beam member 20B. The three kinematic pins 26 are disposed at positions corresponding to the vertices of a triangle (for example, equilateral triangle) and are provided to project upward from the placing surface 7a (see FIG. 5). In this example, the beam member 20A is not provided with a purge unit. The beam member 20A simply supports the container F. On the other hand, the beam member 20B has the purge unit 30 attached thereto. The beam member 20B supports the container F and holds the purge unit 30.

On the bottom surface of the container F, for example, a recess or opening or the like (not illustrated) to receive the kinematic pin 26 are provided. The container F is placed in a predetermined position on the placing surface 7a of the storage rack 1 by such a positioning mechanism. When the container F is placed in the predetermined position, the nozzle 31 of the purge unit 30 is connected to a gas inlet or the like (not illustrated) formed on the bottom surface of the container F, to be able to supply purge gas to the container F.

Figure 7B:
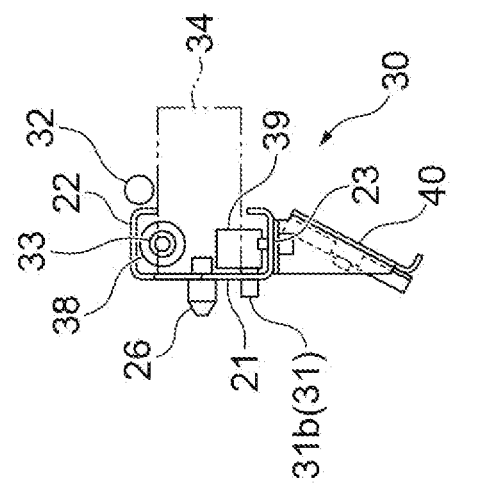
FIG. 7(b) is a side view of FIG. 7(a).
Figure 7A:
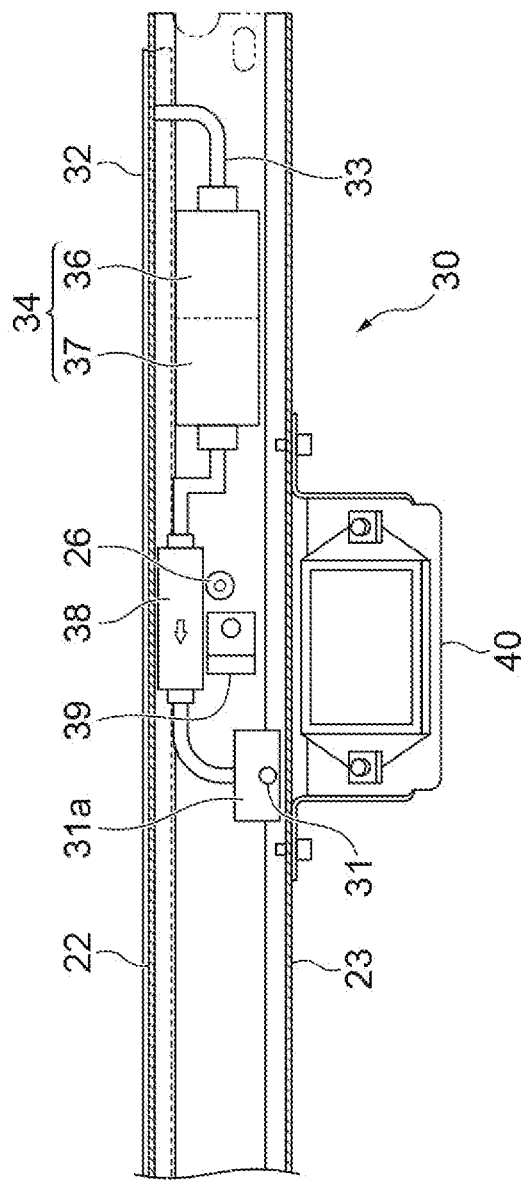
FIG. 7(a) is a plan view illustrating a part of FIG. 6 being enlarged.

As illustrated in FIG. 3, the storage rack 1 is provided with four purge units 30 at positions corresponding to the four loading portions 7. FIG. 7(a) is a plan view illustrating the purge unit 30 portion, and FIG. 7(b) is a side view of FIG. 7(a). As illustrated in FIGS. 7(a) and 7(b), the beam member 20B includes a first flat portion 21 disposed along an XY plane, a second flat portion 22 and a third flat portion 23 connected to and hanging from both ends of the first flat portion 21 in the Y direction. Lower edges of the second flat portion 22 and the third flat portion 23 are bent into an L-shape, for example. The beam member 20A has the same configuration as the beam member 20B. Thus, the beam member 20A and the beam member 20B are installed in an orientation where the C-shaped cross section is open downward. The top surface (surface) 21a of the first flat portion 21 are included in the placing surface 7a of the loading portion 7. That is, out of the first flat portion 21, the second flat portion 22, and the third flat portion 23 included in the C-shaped cross-section, the first flat portion 21 has a horizontal top surface 21a that is included in the placing surface 7a of the loading portion 7. The kinematic pin 26 described above is on the first flat portion 21 in a standing manner.

In FIG. 7(a), the purge unit 30 viewed from the Z direction that is a vertical direction is illustrated, and the second flat portion 22 and the third flat portion 23 are broken off to reveal the purge unit 30 in the interior (the first flat portion 21 is not illustrated). In FIG. 7(b), the purge unit 30 viewed from an extending direction of the beam member 20B is illustrated. As illustrated in FIGS. 3 and 7(b), on the inner surface side of the beam member 20B has a nozzle 31 supplying purge gas into the container F, a distribution pipe 33 sending the purge gas to the nozzle 31, a solenoid valve 36 provided in the distribution pipe 33 and configured to open and close a flow path of the purge gas, and a flow regulation valve 37 provided in the distribution pipe 33 and configured to adjust the purge gas flow are attached. On the inner surface side of the beam member 20B, a filter 38 removing impurities in the purge gas and a loading sensor 39 configured to detect a container F being placed on the loading portion 7 are further attached. The purge unit 30 in this example has the nozzle 31, the distribution pipe 33, the solenoid valve 36, the flow regulation valve 37, the filter 38, and the loading sensor 39 described above. The solenoid valve 36 and the flow regulation valve 37 are included in a regulator 34 provided to the distribution pipe 33 and configured to regulate the purge gas. These devices are correspondingly fixed to the first flat portion 21, the second flat portion 22, and the third flat portion 23 by using support brackets, fastening members, and the like.

As illustrated in FIGS. 5 and 7(*b*), of the purge unit 30, all the devices excluding the nozzle 31 and the regulator 34, namely the distribution pipe 33, the filter 38, and the loading sensor 39, are housed on the inner surface side of the beam member 20B. The nozzle 31 is, when the base member 31*a* (see FIG. 7(*a*)) for attachment is fixed to a back surface of the first flat portion 21, attached to the first flat portion 21. Only a tip 31*b* to be connected to the container F passes through the first flat portion 21 to protrude on the first flat portion 21. The nozzle 31 is disposed such that a position thereof has a predetermined positional relation with respect to the kinematic pin 26. Thus, the nozzle 31 is attached to the inner surface side of the beam member 20B. The regulator 34 is not accommodated on the inner surface side of the beam member 20B, but protrudes downward (see FIGS. 4 and 5).

Figure 6:
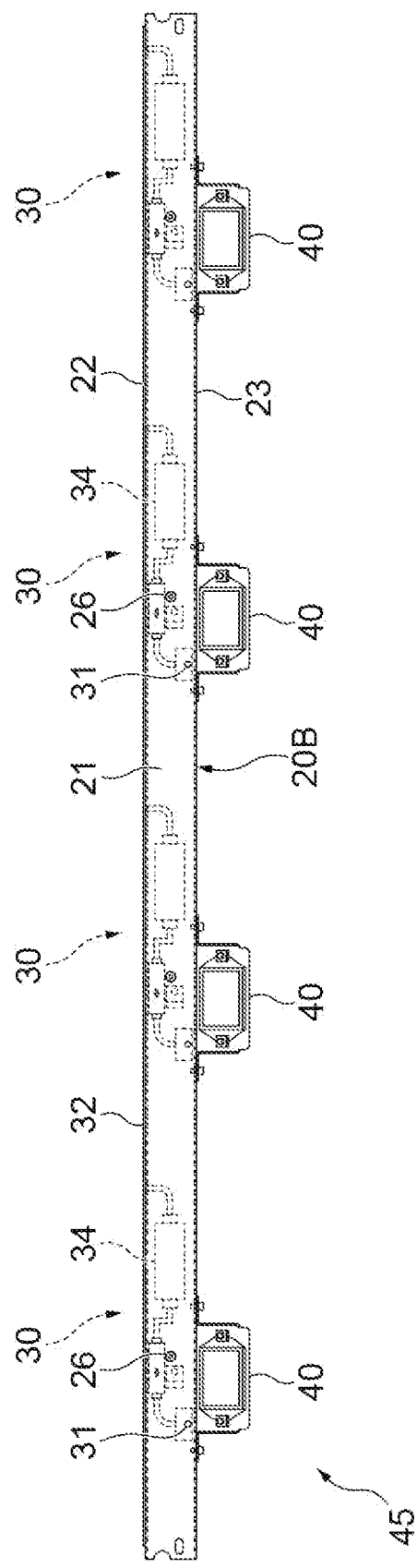
FIG. 6 is a plan view illustrating a beam member to replace when adding a purging function.

As illustrated in FIGS. 6 and 7(*a*), the nozzle 31, the filter 38, the regulator 34 (the solenoid valve 36 and the flow regulation valve 37), and the distribution pipe 33 are disposed in line in the extending direction of the beam member 20B. These devices are each provided within a space required for one loading portion 7 (see FIG. 3) in the X-direction, for example.

On a lower side of the second flat portion 22 of the beam member 20B, a main pipe 32 introducing purge gas from the gas supply pipe 8 (see FIG. 1) to the purge unit 30 is disposed. On the storage rack 1, one main pipe 32 is attached, for example, along the second flat portion 22, to cover the gas supply to the four purge units 30 provided in the four loading portions 7. The distribution pipe 33 described above branches off from the main pipe 32 and receives purge gas introduced by the main pipe 32.

To the beam member 20A and the beam member 20B, reflectors 40 configured to detect the transfer (movement) of containers F from the overhead traveling vehicle 3 are attached respectively in a manner of stretching diagonally outward in both Y-directions.

Figure 9:
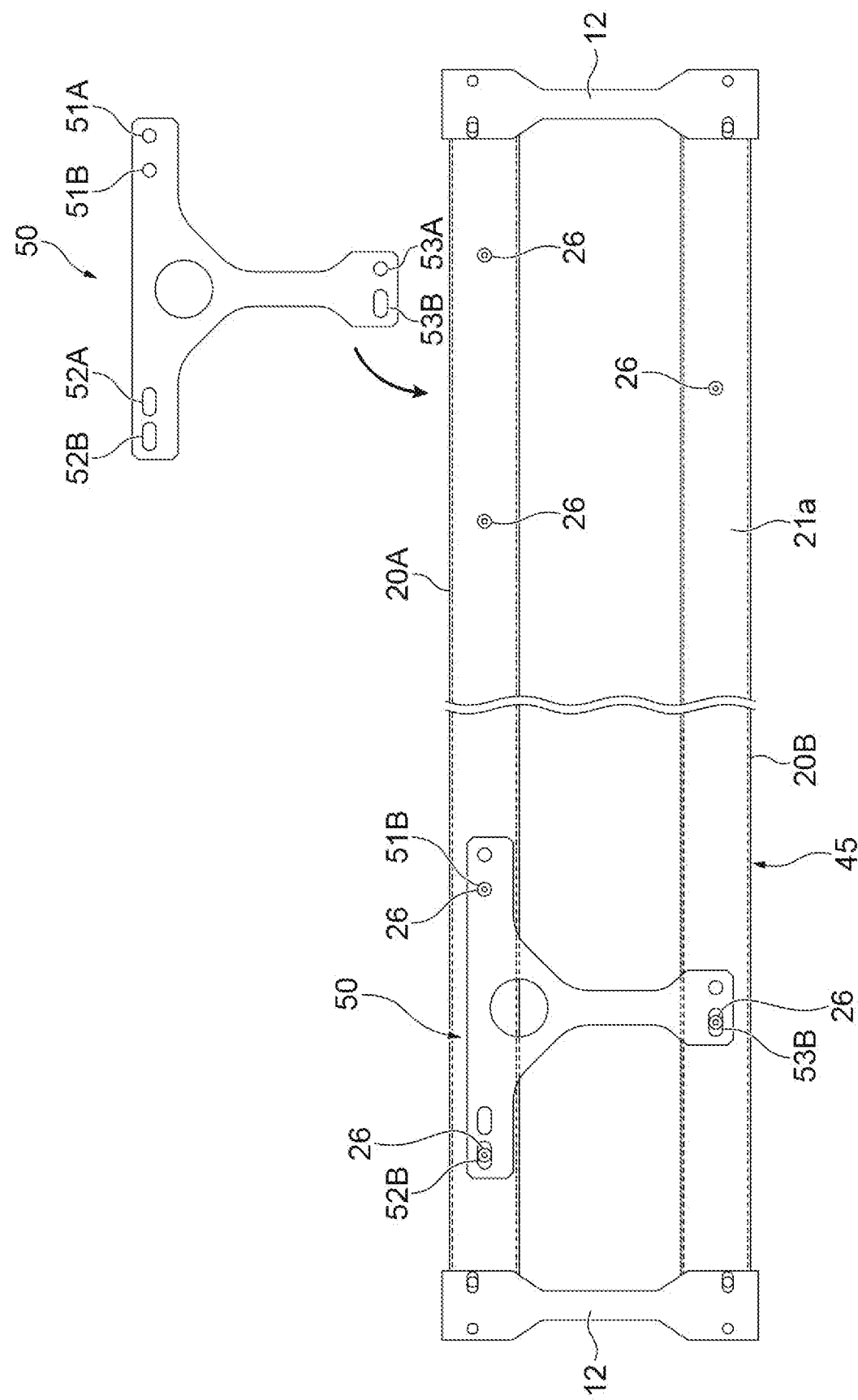
FIG. 9 is a plan view illustrating a positioning work using a jig during assembly work.

Next, referring to FIGS. 6, 8, and 9, the following describes assembly work in a factory of the storage rack 1. The following description describes an example of adding a purging function to an existing storage rack not having a purging function, using a beam 45 with a purge unit (by replacing with a beam 45 with a purge unit). As illustrated in FIG. 6, the beam member 20B of the purge unit 30 is brought in as a beam 45 with a purge unit, with each of the above-described devices of the purge unit 30 assembled on the inner surface side in advance. In other words, for the purge unit 30, the time and effort to attach each of the devices of the purge unit 30 to the beam member 20B in the factory are eliminated. Note that in the beam 45 with purge unit illustrated in FIG. 6, the main pipe 32 and the reflector 40 are also attached in the beam member 20B in advance.

As illustrated in FIG. 9, a mounting jig 50 of a T shape is used in positioning the beam member 20B with respect to the beam member 20A. The mounting jig 50 has two round holes 51A, 51B corresponding to one kinematic pin 26 on the beam member 20A. The round holes 51A, 51B are aligned in an extending direction of the beam member 20A and are spaced slightly apart from each other in the extending direction. Two long holes 52A, 52B are formed corresponding to the other kinematic pin 26 on the beam member 20A. The long holes 52A, 52B are aligned in the extending direction of the beam member 20A and are spaced slightly apart from each other in the extending direction. In addition, the mounting jig 50 has one round hole 53A and one long hole 53B formed thereon corresponding to one kinematic pin 26 on the beam member 20B. The round holes 53A and long holes 53B are aligned in the extending direction of the beam member 20B and are spaced slightly apart from each other in the extending direction.

By inserting the three kinematic pins 26 into the round holes 51A, long holes 52A, and round hole 53A of the mounting jig 50, or by inserting the three kinematic pins 26 into the round hole 51B, the long hole 52B, and the long hole 53B of the mounting jig 50, the beam member 20B is positioned in a desired fixed position with respect to the beam member 20A. In the example illustrated in FIG. 9, the three kinematic pins 26 are respectively inserted into the round hole 51B, the long hole 52B, and the long hole 53B. The beam member 20A and the beam member 20B are then fastened and secured to the support 12 of the base frame 10, as illustrated in FIG. 8. As illustrated in FIG. 8, in one mounting jig 50 (mounting jig 50 on the left side of the figure), the three kinematic pins 26 are inserted into the round hole 51B, the long hole 52B, and the long hole 53B. In the other mounting jig 50 (mounting jig 50 on the right side of the figure), the three kinematic pins 26 are inserted into the round hole 51A, the long hole 52A, and the round hole 53A.

After the beam member 20A and beam member 20B (the beam 45 with the purge unit) are assembled to the base frame 10, the gas supply pipe 8 of the factory is connected to the distribution pipe 33 of the purge unit 30, and the power supply wiring 6 is connected to a necessary point of the purge unit 30. These connection works alone complete the construction of the storage rack 1 with a purging function. After the storage rack 1 is assembled, the mounting jig 50 is removed.

The operation of the storage rack 1 is described below. When the container F is placed on the loading portion 7 and the loading sensor 39 turns ON, the solenoid valve 36 opens and the purge gas flows from the main pipe 32 to the distribution pipe 33. At this time, the flow regulation valve 37 is adjusted to an appropriate opening.

With the storage rack 1 according to this example, the kinematic pin 26, the nozzle 31, the distribution pipe 33, and the regulator 34 can be attached to the beam member 20B, which is one of the beam members 20A, 20B, in advance. Thus, the on-site construction of the storage rack 1 with a purging function can be easily performed. That beam member 20B has the advantage that the main devices required for adding the purging function are already unitized and integrated into the beam member 20B as the purge unit 30 (see the beam 45 with the purge unit illustrated in FIG. 6). For example, when adding the purging function to an existing storage rack not include an existing purging function, it is possible to perform construction easily in a short time and at low cost by simply replacing the beam member 20B (the beam 45 with the purge unit) on site.

The beam member 20B has a C-shaped cross section, and the nozzle 31 is attached to the inner surface side of the beam member 20B. As a result, the nozzles 31 can be disposed compactly and easily. By determining the positional relation of the nozzle 31 with respect to the kinematic pin 26 in a predetermined position, accuracy of placement of the nozzle 31 can be also enhanced.

Out of the three kinematic pins 26 disposed in the loading portion 7, the two kinematic pins 26 are provided in the other beam member 20A, which is different from the beam member 20B. The two positioning pins provided on the other beam member 20A can be used to easily position the beam member 20B to which the devices related to the purging function are attached. In particular, by using the mounting jig 50 during assembly, as in the above example, the effect of eliminating the need for re-teaching after the assembly can be exerted.

Out of the first flat portion 21, the second flat portion 22, and the third flat portion 23 of the beam member 20, the first flat portion 21 has the top surface 21a that is included in the loading portion 7. Since the top surface 21a of the beam member 20B is included in the loading portion 7, there is no need to attach a separate plate or other member to the top surface 21a of the beam member 20B. Thus, the height of the loading portion 7 can be easily adjusted.

With the construction method according to the above example, the storage rack 1 with a purging function can be easily constructed. This is very advantageous in terms of cost reduction. In recent years, there have also been many renewal constructions to add a purging function to a storage rack not having a purging function. With this construction method, the construction of the storage rack 1 can be completed simply by bringing in and assembling the beam 45 with the purge unit 30 pre-assembled, which is very advantageous for such renewal construction.

Although the examples are described above, this disclosure is not limited to the above examples. For example, the beam member 20B may be an angle steel having an L-shaped cross section. Of the first flat portion and the second flat portion that are included in the L-shaped cross section, a horizontal top surface of the horizontally disposed flat portion is included in the loading portion. The positioning pins and nozzles are provided on the horizontal flat surface. Even in that configuration, most of the devices in the purge unit 30 may be attached on the inner surface side of the L-shape.

The number of the base frames 10 of the storage rack 1 is not limited to two. One or more base frames 10 may be provided in a middle of the base frames 10 at both ends in the X direction. The number of the containers F stored on one storage rack 1 is not limited to four, but may be five or more, or three or less.

The one kinematic pin 26 may be provided in the beam member 20A and the two kinematic pins 26 may be provided in the beam member 20B. Even in that configuration, the beam member 20B to which the devices related to the purging function are attached can be easily positioned by using one positioning pin provided on the other beam member 20A.

Of the purge unit 30, the distribution pipe 33 and the solenoid valve 36 may be disposed outside the beam member 20B. Even in that configuration, the distribution pipe 33 and the solenoid valve 36 are still attached to the beam member 20B. The regulator 34 may include only one of the solenoid valve 36 and the flow regulation valve 37, or may include a known regulating device different from the solenoid valve 36 and the flow regulation valve 37. The devices included in the purge unit 30 and their layout may be modified as appropriate.

The above examples describe updating an existing storage rack not having a purging function to one with a purging function by introducing the beam 45 with the purge unit, but this disclosure is not limited to this example. The beam 45 with the purge unit may be used to newly build a storage rack 1 with a purging function.

The purge gas is not limited to nitrogen, but may be air, other inert gases or the like.

The invention claimed is:

1. A storage rack comprising:
   at least two base frames suspended from a ceiling; and
   at least two beam members bridged over the base frames and included in a loading portion on which a container is placed, wherein
   a positioning pin configured to position a container, a nozzle configured to supply fluid into the container, a pipe configured to send the fluid to the nozzle, and a regulator provided in the pipe and configured to regulate the fluid are attached to at least one beam member of the beam members.

2. The storage rack according to claim 1, wherein the at least one beam member is a member having a C-shaped cross section or a L-shaped cross section, and the nozzle is attached to an inner surface side of the at least one beam member.

3. The storage rack according to claim 1, wherein, out of three positioning pins disposed on the loading portion, the one or two positioning pins are provided in another beam member different from the at least one beam member.

4. The storage rack according to claim 1, wherein the at least one beam member has three flat portions included in a C-shaped cross-section or two flat portions included in an L-shaped cross-section, and the surface of one flat portion of the flat portions is included in the loading portion.

5. The storage rack according to claim 2, wherein, out of three positioning pins disposed on the loading portion, the one or two positioning pins are provided in another beam member different from the at least one beam member.

6. The storage rack according to claim 2, wherein the at least one beam member has three flat portions included in a C-shaped cross-section or two flat portions included in an L-shaped cross-section, and the surface of one flat portion of the flat portions is included in the loading portion.

7. The storage rack according to claim 3, wherein the at least one beam member has three flat portions included in a C-shaped cross-section or two flat portions included in an L-shaped cross-section, and the surface of one flat portion of the flat portions is included in the loading portion.

* * * * *